United States Patent [19]

Pai et al.

[11] Patent Number: 5,384,229
[45] Date of Patent: Jan. 24, 1995

[54] PHOTOIMAGEABLE COMPOSITIONS FOR ELECTRODEPOSITION

[75] Inventors: Daniel Y. Pai, Millbury; Stephen S. Rodriguez, Monument Beach; Roger F. Sinta, Woburn, all of Mass.

[73] Assignee: Shipley Company Inc., Marlborough, Mass.

[21] Appl. No.: 879,598

[22] Filed: May 7, 1992

[51] Int. Cl.6 ............................................. G03C 1/492
[52] U.S. Cl. ................................. 430/270; 430/326; 430/905; 430/910; 524/901; 522/27; 522/31; 522/49; 522/59
[58] Field of Search ............... 430/270, 326, 910, 905; 524/901; 522/27, 31, 49, 59

[56] References Cited

U.S. PATENT DOCUMENTS

| | | | |
|---|---|---|---|
| 4,491,628 | 1/1985 | Ito et al. | 430/176 |
| 4,592,816 | 6/1986 | Emmons et al. | 204/15 |
| 4,632,900 | 12/1986 | Demmer et al. | 430/323 |
| 4,678,737 | 7/1987 | Schneller et al. | 430/270 |
| 4,810,613 | 3/1989 | Osuch et al. | 430/281 |
| 4,839,253 | 6/1989 | Demmer et al. | 430/190 |
| 4,877,818 | 10/1989 | Emmons et al. | 522/26 |
| 4,898,656 | 2/1990 | Hoshino et al. | 204/181.1 |
| 4,904,568 | 2/1990 | Kondo et al. | 430/294 |
| 4,931,379 | 6/1990 | Brunsvold et al. | 430/270 |
| 4,939,070 | 7/1990 | Brunsvold et al. | 430/312 |
| 4,965,073 | 10/1990 | Maruyama et al. | 430/292 |
| 4,968,581 | 11/1990 | Wu et al. | 430/192 |
| 4,975,351 | 12/1990 | Akaki et al. | 430/190 |
| 4,996,136 | 2/1991 | Houlihan et al. | 430/313 |
| 5,002,858 | 3/1991 | Demmer et al. | 430/325 |
| 5,004,672 | 4/1991 | D'Ottavio et al. | 430/314 |
| 5,045,431 | 9/1991 | Allen et al. | 430/270 |
| 5,055,164 | 10/1991 | Hawkins et al. | 427/96 |
| 5,073,478 | 12/1991 | Banks et al. | 430/317 |
| 5,075,199 | 12/1991 | Schwalm et al. | 430/281 |
| 5,080,998 | 1/1992 | Irving et al. | 430/169 |
| 5,110,708 | 5/1992 | Kim | 430/270 |
| 5,134,054 | 7/1992 | Iwasawa et al. | 430/270 |
| 5,230,984 | 7/1993 | Tachiki et al. | 430/270 |
| 5,279,923 | 1/1994 | Hiro et al. | 430/270 |

FOREIGN PATENT DOCUMENTS

| | | |
|---|---|---|
| 2001384 | 4/1990 | Canada . |
| 0424124 | 4/1991 | European Pat. Off. ............ 430/270 |
| 62-235496 | 10/1987 | Japan . |

*Primary Examiner*—John Kight, III
*Assistant Examiner*—R. F. Johnson
*Attorney, Agent, or Firm*—Robert L. Goldberg; Peter F. Corless

[57] ABSTRACT

The present invention provides photoimageable compositions, processes and articles of manufacture. In particular, the invention provides a process comprising electrophoretically applying a coating layer of a photoimageable composition onto a conductive surface, the composition comprising a material that contains one or more photoacid labile groups. The photoimageable compositions of the invention preferably comprise a photoacid generator, a material that contains one or more acid-clearable functional groups, and a carrier resin that contains one or more functional groups that are, or can be treated to be, at least partially ionized.

22 Claims, No Drawings

PHOTOIMAGEABLE COMPOSITIONS FOR ELECTRODEPOSITION

BACKGROUND OF THE INVENTION

1. Field Of The Invention

The present invention relates to photoimageable compositions that comprise a material that contains one or more photoacid labile groups. In preferred aspects, the compositions are applied electrophoretically to conductive substrates.

2. Background Art

Photoimageable compositions include photoresists which are capable of transferring an image onto a substrate such as a printed circuit board or a lithographic plate. These resists can be negative-acting or positive-acting. After a film layer of a photoresist is deposited on a surface, the film is selectively exposed, typically through a photomask, to a source of activating energy such as ultraviolet light. The photomask has areas that are opaque and other areas that are transparent to the ultraviolet light. The pattern on the photomask formed by opaque and transparent areas defines the pattern, such as a circuit, to be transferred to the substrate.

Exposed portions of a negative-acting photoresist become less soluble in a developing solution than unexposed areas as the result of a photochemical reaction, for example, between a photoinitiator and an ethylenically unsaturated resin of the resist composition. This difference in solubility allows for the selective removal of the photoresist and the transfer of the photomask image to the substrate. In the case of positive-acting photoresists, exposure to activating radiation will cause the coating to become more soluble in a developing solution than the unexposed areas. The imaged photoresist may act as a protective coating for subtractively etching a metal substrate, known as print-and-etch, or allow the exposed bare metal surface to be further built up in thickness by electroplating methods, known as print-and-plate. The resist may then be selectively stripped. For print-and-etch processes, the exposed metal on the substrate may be etched to form the desired pattern or circuit on the substrate surface. The historical background, types and operation of conventional photoresists, are generally described in Photoresist Materials and Processes, W. DeForest, McGraw-Hill, 1975, and Coombs, *Printed Circuits Handbook*, McGraw Hill (3rd Ed. 1988), both incorporated herein by reference.

Electrophoretic deposition of certain photoresist coatings has been reported. See, for example, U.S. Pat. No. 4,592,816, incorporated herein by reference for its disclosure of making and using electrophoretic photoresists. Electrophoretic deposition involves a process of electrophoresis which is the motion of charged particles through a liquid medium under the influence of an applied electrical field. The deposition is conducted in a cell with the conductive substrate to be coated serving as one of the electrodes. Deposition of a positively charged material onto a negatively charged cathode is referred to as cataphoresis while deposition of a negatively charged material onto an anode is referred to as anaphoresis.

Another class of photosensitive resists is liquid type photoresists. The solid components of these compositions are dissolved in an organic solvent and are applied to a substrate surface by means such as dip-coating, roller-coating, spin coating, curtain coating or screen coating. After application of the liquid composition, the coated substrate is typically heated to remove the volatile organic solvent carrier.

More recently, so-called "chemically amplified" positive-tone liquid type resist systems have been reported. More specifically, certain cationic photoinitiators have been used to induce acid-catalyzed cleavage of functional groups of one or more components of the resist. In particular, certain cationic photoinitiators have been used to induce cleavage of certain "blocking" groups pendant from a photoresist binder, or cleavage of certain blocking groups that comprise a photoresist binder backbone. See, for example, U.S. Pat. Nos. 5,075,199; 4,968,581; 4,883,740; 4,810,613 and 4,491,628, and Canadian Patent Application 2,001,384, all of which are incorporated herein by reference for their teaching of the described materials containing acid labile blocking groups, and methods of making and using the same. Such cleavage is reported to create different solubility characteristics in exposed and unexposed areas of the polymer. Upon selective cleavage of the blocking group through exposure of the resist, a polar functional group is said to be provided, for example, carboxyl or imide.

SUMMARY OF THE INVENTION

The present invention comprises photoimageable compositions that utilize photogenerated acid-induced cleavage of functional group(s) (i.e., "acid labile groups") of a composition component to thereby provide increased aqueous alkaline solubility in exposed regions of a coating layer of the composition. The term acid labile group or groups as used herein generally refers to a functional group of a composition component that will undergo chemical bond cleavage in the presence of photogenerated acid, typically during a post-exposure bake processing step of a composition coating layer.

The photoimageable compositions of the invention are preferably formulated as electrodepositable compositions and electrophoretically applied to conductive substrates.

A preferred process of the invention comprises electrophoretically applying a coating layer of a photoimageable composition onto a conductive surface, the composition comprising a material containing one or more acid labile groups; exposing the composition coating layer to activating radiation; and developing the exposed coating layer to provide a relief image on the conductive surface.

The photoimageable compositions of the invention preferably comprise a material that contains one or more acid labile functional groups, a resin that comprises hydrophilic carrier groups, and a radiation sensitive component that generates acid upon exposure to activating radiation.

The material that comprises acid labile groups suitably will be a monomer, oligomer or polymer, or mixtures thereof. Suitable polymers include those where the acid labile groups are either pendant to the polymer backbone or are a unit of the polymer backbone. A resin that contains hydrophilic carrier groups is generally referred to herein as a "carrier resin". The hydrophilic carrier groups of the carrier resin include anaphoretic and cataphoretic functional groups. A carrier resin contains suitably either anaphoretic groups or cataphoretic groups, or both anaphoretic and cataphoretic functional groups. Anaphoretic carrier groups are functional groups that are at least partially negatively charged, ionized or otherwise negatively polarized, or functional groups that are capable of being at least partially negatively charged, ionized or otherwise negatively polarized upon treatment with a base. The cataphoretic carrier groups are functional groups that are at least partially positively charged, ionized or otherwise positively polarized, or functional groups that are capable of being at least partially positively charged, ionized or otherwise positively polarized upon treatment with an acid. The acidic or basic materials used to charge, ionize or otherwise provide polarity to the carrier groups are sometimes referred to herein as "ionizers" or "ionizer solutions".

In addition to electrophoretic applications, the photoimageable compositions of the invention also will be suitably used as a liquid coating composition or as a dry film. While the composition of the invention will have utility in a wide variety of applications, the compositions are particularly suitable for use in the manufacture of electronic printed circuit boards and other electronic packaging substrates. Accordingly, processes are provided for the manufacture of printed circuit board substrates including processes for permanently altering a conductive surface for the preparation of a printed circuit board. The invention also provides processes for forming a relief image on a substrate and novel articles of manufacture at least partially coated with the compositions of the invention.

The term "permanently altering" or "permanent alteration" of a conductive surface or other such terms as used herein is intended to include any treatment in a manner that permanently alters the conductive surface such as by etching to remove metal; or adding metal by means such as electroplating or electroless methods.

The term "conductive surface" as used herein means any surface sufficiently conductive to permit electrophoretic deposition of an organic coating composition. Metal surfaces are preferred conductive surfaces and include without limitation, copper, nickel, aluminum, titanium, gold, palladium, etc., and alloys thereof. For the manufacture of printed circuits, the conductive surface would typically comprise a copper layer over a dielectric base material such as epoxy, polyimide, polytetrafluoroethylene, polyethylenesulfone, polyetherimide and the like.

DETAILED DESCRIPTION OF THE INVENTION

The photoimageable compositions of the invention comprise a material that comprises one or more acid labile groups. The material comprising one or more acid labile groups is suitably a monomer, oligomer or polymer, or mixtures thereof.

Suitable monomers that contain one or more labile groups include, for example, t-butyloxycarboxy-bis-phenol-A and t-butylacetoxy-bis-phenol-A.

Preferred polymers include those where acid labile groups are either pendant to the polymer backbone or are a unit of the polymer backbone. A particularly preferred polymer is a phenolic resin where at least a portion of the resin's hydroxyl groups are bonded to pendant acid labile groups. Exemplary phenolic resins include phenol aldehyde condensates known in the art as the novolak resins, homo and copolymers of alkenyl phenols, resins that contain both phenol and nonaromatic cyclic alcohol units, and homo and copolymers of N-hydroxyphenyl-maleimides.

Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons, more preferably from about 3,000 to 10,000 daltons.

Preparation of novolak, poly(vinylphenol) and other phenolic resins are disclosed in numerous publications such as DeForest, *Photoresist Materials and Processes*, McGraw-Hill Book Company, New York, Ch. 2, 1975; Moreau, *Semiconductor Lithography Principles, Practices and Materials*, Plenum Press, New York, Chs. 2 and 4, 1988; and Knop and Pilato, *Phenolic Resins*, Springer-Verlag, 1985, all of which are incorporated herein by reference.

Another suitable phenolic resin that comprises pendant acid labile groups is a polymer containing phenolic units and nonaromatic cyclic alcohol units analogous in structure to the novolak and poly(vinylphenol) resins. In particular, partially hydrogenated poly(vinylphenol) and novolak resins are preferred. Such copolymer resins are described in European Published Patent Application No. 0 401 499 having a publication date of Dec. 12, 1990, incorporated herein by reference.

As noted, at least a portion of available hydroxyl moieties of a phenolic polymer are bonded to suitable acid labile blocking groups. Suitable blocking groups in general are those that upon photocleavage provide a polar moiety such as hydroxyl or carboxylate. Further, the acid labile groups should be generally stable to treatment with an ionizer solution, conditions of electrolysis, and any pre-exposure heat treatment. Further, the acid labile groups should not substantially interfere with photoactivation of the composition.

Preparation of a polymer containing pendant acid labile groups can be suitably carried in accordance with the following Schemes IA and IB in which preferred phenolic resins are shown condensed with a compound that comprises an acid labile group R and a suitable leaving group L.

Scheme IA

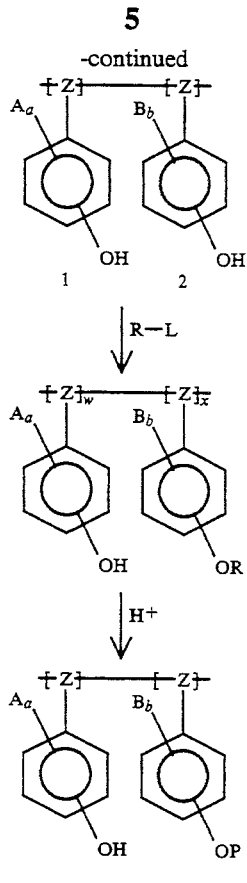

Scheme IB

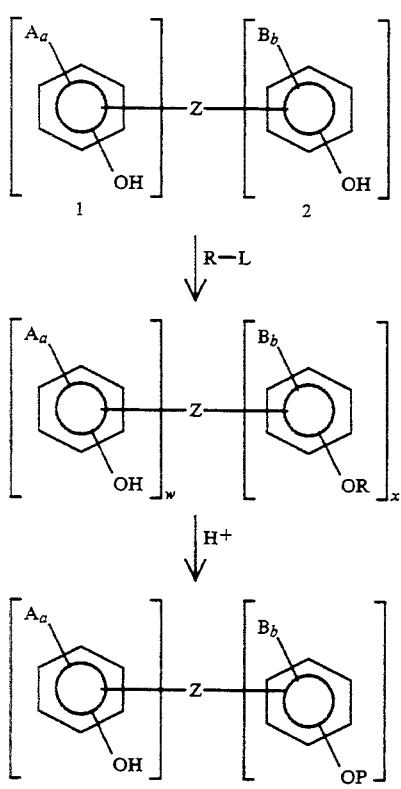

In the Schemes, units 1 and 2 represent phenolic repeat units of the specified resin, and Z is an alkylene group having from 1 to 3 carbon atoms. Units 1 and 2 are suitably the same or different. Thus, A is suitably a variety of substituents on the aromatic ring such as lower alkyl having from 1 to 3 carbon atoms, halo such as chloro or bromo, alkoxy having from 1 to 3 carbon atoms, aryl such as phenyl or benzyl, hydroxyl, nitro, amino, etc.; a is an integer varying from 0 to 3; B is a substituent such as lower alkyl having from 1 to 3 carbon atoms, halo such as chloro or bromo, alkoxy having from 1 to 3 carbon atoms, aryl such as phenyl or benzyl, hydroxyl, nitro, amino, etc. provided that at least 3 of said B substituents are hydrogen; and b is an integer varying between 0 and 3.

In the above Schemes, R is an acid labile blocking group; L is a leaving group; P is the group provided upon acidic cleavage of the acid labile blocking group R; W is the mole fraction of units 1 and 2 in the resin that are blocked by a group R; and X is the mole fraction of units 1 and 2 in the resin that do not contain an acid labile group after the condensation reaction of the resin with the compound R-L.

It should be appreciated that Schemes IA and IB are illustrative of exemplary resins only, and that other materials may be similarly treated to provide such pendant acid labile groups. For example, a resin that comprises both phenolic and nonaromatic cyclic alcohol units can be represented in the above Schemes by unit 1 designating a phenolic unit, unit 2 designating a nonaromatic cyclic alcohol unit, $A_a$ and B the same as defined above, and b designating an integer from 0 to 6.

As depicted in the above Schemes, the acid labile group R of the polymers is suitably provided by an condensation reaction with the preformed polymer and a compound that comprises the acid labile group R and a suitable leaving group L, for instance a halogen such as bromide or chloride. For example, where R is the particularly preferred t-butoxy carbonyl methyl group, L-butyl haloacetate (e.g., t-butyl chloroacetate) is added to a solution of the polymer and a suitable base, and the mixture stirred typically with heating. A variety of bases may be employed for this condensation reaction including hydrides such as sodium hydride and alkoxides such as potassium t-butoxide. An acidic condensation can also be employed. The condensation reaction is typically carried out in an organic solvent. A variety of organic solvents are suitable as is apparent to those skilled in the art. Tetrahydrofuran and dimethylformamide are preferred solvents. Suitable conditions of the condensation reaction can be determined based on the constituents used. For example, an admixture of sodium hydride, t-butylchloroacetate and a poly(vinylphenol) is stirred for about 15 to 20 hours at about 70° C.

The percent substitution of the phenolic resin with the acid labile groups can be controlled by the amount of the acid labile compound that is condensed with the resin. The percent substitution of hydroxyl sites of the resin can be readily ascertained by proton and carbon-13 NMR.

Other methods of preparation of materials containing acid labile groups are apparent to those skilled in the art. For example, a resin can be prepared by polymerization of monomers that comprise acid labile units, for example by a free radical or ionic polymerization reaction. Suitable monomers containing acid labile groups will include for example p-(t-butoxycarbonyloxy)styrene and p-(t-amyloxycarbonyloxy)styrene. Such monomers also can be polymerized with monomers free of acid labile groups including vinyl substituted phenols such as hydroxystyrene and (hydroxy)-alpha methylstyrene to provide a phenolic resin wherein only a portion of hydroxyl sites of the polymer are substituted with acid labile groups.

It has been found that a phenolic resin can be condensed with mixtures of two or more different acid labile groups to provide a mixture of acid labile groups bonded pendant to the polymer backbone. If the polymer is condensed with two or more acid labile groups, then groups R and P of the above formula will be a mixture of different groups. For example, if the phenolic polymer depicted in Scheme IA or IB is first condensed with a compound of the formula R'L, and then condensed with a compound of the formula R"L, where R' and R" of said formulas are two different acid labile moieties, and L is a leaving group, the polymer will comprise a mixture of R' and R" acid labile groups.

Suitable acid labile groups include acetate groups such as acetate groups of the formula $-CR^1R^2C(=O)-O-R^3$, where $R^1$ and $R^2$ are each independently selected from the group of hydrogen, an electron withdrawing group such as halogen, and substituted and unsubstituted alkyl; and $R^3$ is selected from the group of substituted or unsubstituted alkyl, substituted or unsubstituted aryl, or substituted or unsubstituted benzyl. The substituents of such alkyl and aryl groups of $R^1 R^2$ and $R^3$ can be, for example, one or more halogen, alkyl, alkoxy, aryl or benyzl. The alkyl groups of the acetate moieties of the above formula preferably have from 1 to about 10 carbon atoms, more preferably from 1 to about 6 carbon atoms. The aryl groups of the acetate moieties of the above formula preferably have from 1 to about 10 carbon atoms, and typically are phenyl. The benzyl groups of the acetate moieties of the above formula preferably have from 7 to about 13 carbon atoms. $R^1$ and $R^2$ suitably each can be hydrogen. It has been found that if $R^1$ and/or $R^2$ are halogen or other suitable electron-withdrawing group, upon acidic cleavage of the acetate group a highly polar moiety is provided along with enhanced solubility differentials between exposed and unexposed regions of a coating layer of the subject composition. The difluoro group (i.e., $R^1$ and $R^2$ both fluoro) is particularly suitable for such purposes and provides extremely high dissolution differentials between exposed and unexposed regions of a photoimageable coating layer with only modest levels of substitution of the total number of hydroxy groups of the resin. This difluoro acetate group can be provided by alkaline condensation of a phenolic polymer with t-butyl chlorodifluoroacetate ($ClCF_2C(=O)OC(CH_3)_3$). In a preferred aspect of the invention, $R^3$ is preferably tert-butyl (i.e., R is the tert-butyl acetate group). Acid degradation of this group liberates isobutylene to provide the polar acetic acid ether moiety pendant to the polymer backbone.

It is understood that a wide range of acid labile groups are suitable, including many of the groups described in the patents incorporated by reference above. For example, suitable acid labile groups include oxycarbonyl groups of the formula $-C(=O)-O-R^3$, where $R^3$ is the same as defined above. Preferably, $R^3$ is tert-butyl or benzyl (i.e., R is the t-butoxy carbonyl or benzyloxy carbonyl group). These groups can be grafted onto, e.g., a phenolic polymer by alkaline condensation. For example, a phenolic resin can be reacted with di-tert-butyl dicarbonate under alkaline conditions at room temperature or with heating in a suitable solvent such as tetrahydrofuran.

In the case where the material containing one or more acid labile groups is a phenolic resin, it is generally preferred that only a portion of the resin's hydroxyl sites are blocked with acid labile groups. If the resin contains a relatively large portion of acid labile groups, exposure to activating radiation can result in cleavage of a significant mass of the resist. This can result in shrinkage of the photosensitive composition in exposed regions and thereby compromise resolution of a patterned image. On the other hand, a photoimageable composition should comprise a sufficient amount of acid labile groups so that acceptable solubility differentials can be achieved between exposed and unexposed regions of a coating layer of a composition. A solubility differential of 10 to 1 is suitable, more preferably a differential of at least 100 to 1. In general, from about 20 to 60 percent of the total hydroxyl sites of a phenolic resin are suitably substituted with acid labile groups; that is, in the above Schemes, the coefficient X represents from 20 to 60 mole percent of the polymer. It has been found that lower levels of acid labile group substitution can be employed for the above described phenolic resins containing both phenolic and nonaromatic cyclic alcohol units.

It should be appreciated that the material comprising one or more acid labile groups suitably is, at least prior to photoactivation, essentially or completely free of any at least partially ionized anaphoretic or cataphoretic carrier groups. Further, many preferred materials that contain acid labile groups will be essentially or completely free of at least partially ionized cataphoretic carrier groups even after photoactivation.

The concentration of the material containing acid labile group(s) in a composition of the invention may vary within relatively broad ranges, and in general the acid labile material component is employed in a composition in an amount of from about 8 to 60 weight percent of total solids of the composition. As used herein, the term total solids of a composition refers to all components of a composition other than a solvent carrier.

The compositions of the invention also comprise a carrier resin. The carrier resin comprises functional groups that are at least partially positively or negatively charged, or can become at least partially positively or negatively charged upon treatment with an acid or base respectively. It should be appreciated that the carrier resin suitably may be free or at least substantially free of acid labile groups. Carrier resins suitable for use in the compositions of the invention include, for example, acrylic and other vinyl polymers, epoxy polymers, polyurethanes, polyesters, polyamides, and copolymers thereof. Acrylic resins are generally preferred.

Suitable cataphoretic carrier groups are for example, quaternary ammonium groups, phosphonic, sulfonium groups and sulfoxonium groups. Other cataphoretic groups, such as amine groups, may also be used. Acids that are useful to ionize or polarize these groups include lactic acid, acetic acid, glycolic acid, hydroxyacetic acid, hydrochloric acid and phosphoric acid.

Suitable anaphoretic carrier groups are for example, carboxylate groups. Bases that are useful to ionize or polarize these groups include triethanolamine, potassium hydroxide, triethylamine and morpholine.

The compositions of the invention may contain one or more carrier resins. For a given electrodepositable composition of the invention, the carrier resin component should contain a sufficient amount of anaphoretic or cataphoretic carrier groups so that after treatment with an ionizer solution the composition is sufficiently water dispersible to enable electrodeposition of the composition. If the carrier resin contains both cataphoretic and anaphoretic carrier groups, the mole ratio of cataphoretic to anaphoretic carrier groups may suitably vary from 5:95 to 95:5.

The carrier resin of the invention can be synthesized by procedures known in the art, and specific reaction conditions can be determined by the skilled artisan based on the constituents used. Free radical solution polymerization is particularly suitable. Typical reaction conditions include admixing a plurality of monomers in a suitable solvent and condensing the monomers by means of a free radical initiator. A single monomer can be employed to provide a homopolymer, or a mixture of monomers can be employed to provide a copolymer provided at least one of the monomers of said plurality comprises one or more cataphoretic or anaphoretic carrier groups. Suitable monomers comprising anaphoretic carrier groups include, for example, methacrylic acid and acrylic acid. Suitable monomers comprising cataphoretic carrier groups include, for example, 2-(dimethylamino)ethyl methacrylate, 3-(dimethylamino) propylmethacrylamide and methylamino ethylmethacrylate. Somewhat less prepared but not excluded from the scope of the invention are carrier resins having sterically bulky pendant groups such as t-butyl pendant groups and pendant alkyl groups having 6 or more carbon atoms; hence, less preferred are those monomers which comprise such bulky groups. A solution of the monomers is suitably added to a reaction vessel over time with simultaneous addition of a solution of a free radical initiator solution such as t-butyl peroctoate in a suitable solvent. The reaction mixture is suitably heated to about 100° C. or more to complete the condensation reaction.

A variety of polymers that contain sufficient cataphoretic or anaphoretic carrier groups are suitable for use as the carrier resin in accordance with the invention. For example, epoxy carrier polymers are suitable, typically prepared by reaction of di-epoxides with diols, diamines or dicarboxylic acids. The polymerization of a di-epoxide with a diol can be carried out in the presence of an amine to incorporate cataphoretic carrier groups into the polymer, and anaphoretic carrier groups can be incorporated into the polymer by chemical reactions which attach carboxylic acid moieties to the epoxy polymer. Preparation of suitable carrier resins is also described in above incorporated U.S. Pat. No. 4,592,816.

The molecular weight (weight average) of the carrier resin suitably varies within a relatively wide range, and typically is less than 100,000 and more typically is from about 10,000 to 90,000.

The concentration of the carrier resin in a composition of the invention may vary somewhat widely. For an electrodepositable composition of the invention, the carrier resin should be present in an amount sufficient to enable emulsification and electrodeposition of the composition. The carrier resin is suitably employed in a composition in an amount of from about 10 to 90 weight percent of total solids of the composition.

The compositions of the invention also comprise a photoacid generator compound, i.e., a compound that generates acid upon exposure to activating radiation. The photoacid generator should be present in a composition in an amount sufficient to enable development of a coating layer of the composition following exposure to activating radiation and a post-exposure bake step. For an electrodepositable composition of the invention, preferably the photoacid generator compound is sufficiently organic solvent-soluble while still enabling formation of a stable micelle in an aqueous emulsion. Greater organic solvent-solubility can be imparted to a photoacid generator by grafting an aliphatic ligand such as an alkyl group onto the photoactive compound.

Nonionic acid generators will be useful in the compositions of the invention including the family of sulfonated esters such as sulfonyloxy ketones and nitrobenzyl sulfonate esters. Sulfonated esters have been reported in *J. of Photopolymer Science and Technology*, vol. 4, no. 3, 337–340 (1991), incorporated herein by reference, including benzoin tosylate, t-butylphenyl alpha-(p-toluenesulfonyloxy)- acetate, and t-butyl alpha-(p-toluenesulfonyloxy)- acetate. A preferred sulfonated ester is dodecyl-3,4,5-tris-(methanesulfonyloxy) benzoate. These acid generators can be suitably prepared by condensing a phenol (e.g., a nitrophenol) with an alkylsulfonic acid chloride.

The onium salts also will be useful photoacid generators in the compositions of the invention. Onium salts with weakly nucleophilic anions are more preferred particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and B, Ia and B and I of the Periodic Table, for example, halonium salts, quaternary ammonium, phosphonium and arsonium salts, aromatic sulfonium salts and sulfoxonium salts or seleonium salts. Examples of onium salts and use thereof can be found in U.S. Pat. Nos. 4,442,197; 4,603,101; 4,624,912, and 5,073,478, all incorporated herein by reference.

At least some non-ionic halogenated organic photoactive compounds also should be suitable photoacid generators such as, for example, 1,1-bis[p-chlorophenyl]-2,2,2-trichloroethane (DDT); 1,1-bis[p-methoxyphenyl]-2,2,2-trichloroethane (methoxychlor$^R$); 1,2,5,6,9,10-hexabromocyclododecane; 1,10-dibromodecane; 1,1-bis[p-chlorophenyl]2,2-dichloroethane; 4,4'-dichloro-2-(trichloromethyl)benzhydrol, 1,1-bis(-chlorophenyl)2-2,2-trichloroethanol (Kelthane$^R$); hexachlorodimethylsulfone; 2-chloro-6-(trichloromethyl)-pyridine; O,O-diethyl-O-(3,5,6-trichloro-2-pyridyl)-phosphorothioate (Dursban$^R$); 1,2,3,4,5,6-hexachlorocyclohexane; N(1,1-bis[p-chlorophenyl]-2,2,2-trichloroethylacetamide, tris[2,3-dibromopropyl] isocyanurate; 2,2-bis[p-chlorophenyl]-1,1-dichloroethylene; and their isomers, analogs, homologs and residual compounds. Of the above, tris[2,3-dibromopropyl] isocyanurate is particularly preferred. Acid generators are also disclosed in European Published Patent Application No. 0232972, incorporated herein by reference. The term residual compounds as used above is intended to include closely related impurities or other modifications of the above halogenated organic compounds which result during their synthesis and which may be present in minor amounts in commercial products containing a major amount of the above compounds.

The photoacid generator component of the compositions of the invention should be present in a composition in an amount sufficient to enable development of a coating layer of the composition following exposure to activating radiation. In general, the photoacid generator is suitably employed in a composition in an amount of from about 2 to 15 weight percent based on the total weight of the material that contains acid labile groups, more typically from about 2 to 5 weight percent of the weight of the material containing acid labile groups.

To promote uniform electrodeposition of the composition of the invention to a metallized substrate, a coalescing agent can be added to the composition. Preferred coalescing agents include both water or partially water soluble and water insoluble agents. Of the water soluble or partially water soluble agents, the preferred agents include 1-nitropropane, 2-nitropropane, methyl pyrrolidone and propylene glycol methyl ether. Other coalescing agents include copolymers of ethyl acrylate such as Modaflow (Monsanto), ethylene glycol ethyl hexyl ether, Texanol$^R$ (2,2,4-trimethyl-1,3-pentanediol monoisobutyrate) (Eastman Kodak) and surfactants such as Flexrecin (CasHem).

The amount of coalescing agent employed may vary depending on a number of factors including the partition coefficient between the organic and aqueous phases. In general, for water soluble or partially water soluble coalescing agents, the amount may be up to about 25% by weight of the emulsion (including both organic and aqueous portions). For water insoluble coalescing agents, the amount may be up to about 15% by weight of the organic components of the emulsion, preferably between 1-6% by weight.

Dyes may also be used in order to enhance visual contrast and to facilitate inspection and subsequent repair (if necessary) when the photoresist is applied. Preferred dyes include the triarylmethane dyes such as methyl violet, the anthraquinones such as Oil Blue N and the like. The amount of dye used generally depends on the thickness of the photoresist deposited. Typically the amount of dye used is less than 1% by weight of the emulsion solids for applied photoresist thicknesses of 15 microns or more. Thinner photoresist coatings may require the use of more dye to maintain the visual contrast between the substrate and the photoresist.

In general, the electrophoretic compositions of the invention are formed by mixing a solution of the material comprising one or more acid labile groups and the carrier resin. The photoacid generator compound(s), dye and other additives can be dissolved in a suitable organic solvent and added to the resin mixture. Suitable solvents include glycol ethers such as propylene glycol methyl ether, ethylene glycol ethyl hexyl ether, and mixtures thereof. At this point, the resin composition may be emulsified for cataphoretic electrodeposition processes by treatment with a suitable acidic ionizer such as lactic acid; or to produce an anaphoretic electrodeposition bath, the resin composition may be treated with a basic ionizer such as triethanolamine or an alkali hydroxide salt solution such as an aqueous potassium hydroxide solution. After the composition is completely mixed, water is slowly added while stirring to form the emulsion. The solids content of the emulsion can be adjusted by diluting the emulsion with additional water. Suitable concentrations of the organic composition can vary somewhat widely, for example from about 5 to 30 weight percent of the organic composition based on total weight of the aqueous emulsion.

In general, the electrodepositable compositions of the invention are applied to a substrate in the same manner as prior electrodepositable compositions. For example, to apply a composition of the invention that comprises a carrier resin containing at least partially charged cataphoretic groups, a substrate having a conductive surface (e.g. a copper clad printed circuit board substrate such as a copper clad epoxy or polyimide dielectric layer) is immersed in the aqueous mixture containing the composition to serve as the cathode. A stainless steel bar or other suitable material is immersed in the solution to serve as the anode. The electrodes are connected to an electrical potential. Factors that can affect film thickness include applied voltage, the time that voltage is applied, the anode/cathode distance, and the temperature of the photoresist emulsion. After electrodeposition of the composition, the conductive substrate is removed from the solution or emulsion, deionized water rinsed and dried, and optionally baked at about 100° C. to dry and further coalesce the film. This general procedure is also suitable for anaphoretic deposition. Thus, after a composition comprising a carrier resin containing at least partially charged anaphoretic groups has been treated with a basic ionizer, the conductive substrate is used as the anode and the inert counter electrode is used as the cathode.

Preferably the conductive substrate is vibrated during electrolysis at a sufficient frequency and amplitude to dislodge any gases that may adhere to the substrate surface. Gases often adhere to the substrate surface, and upon electrodeposition can result in pinholes or other coating flaws. The conductive surface is conveniently vibrated by attaching a suitable motor to the deposition vessel. For example, an electric type motor or pneumatic type motor may be used, although it is clear that other devices capable of providing the described vibrations could be employed, for example a transducer. In general, the vibrating device is operated to provide between about 600 and 30,000 vibrations per minute and, preferably, at least about 3,000 vibrations per minute. Preferably, the vibration device is mounted on the deposition vessel whereby the vibrations are isolated and transferred directly to the conductive substrate disposed in the bath.

Exposure of the electrodeposited composition is achieved by use of an appropriate phototool that contains areas that are selectively opaque and transparent to activating radiation. See D. S. Elliot, *Integrated Circuit Fabrication Technology*, ch. 8, p. 165-207, incorporated herein by reference. In general, the substrate coating is exposed by placing the phototool between the substrate and the source of activating radiation, and then exposing the coating film to the radiation through the mask to form a latent image in the coating layer. Following exposure, the film layer of the composition is baked at temperatures from about 60° C. to 140° C. for between about 10 and 60 minutes. During this post-exposure thermal treatment acid labile groups can undergo cleavage in exposed regions of the coating layer.

After exposure and such thermal treatment, the composition coating layer can be developed by treatment (e.g., immersion) with a suitable developer such as an aqueous alkaline solution which removes the more soluble exposed regions of the coating layer to form a relief image. Specifically, suitable developer solutions include aqueous solutions containing from about 0.5 to 5 weight percent of sodium carbonate or an alkali hydroxide salt such as sodium or potassium hydroxide. Suitable developers are commercially available such as aqueous-based Developer 303A available from the Shipley Co. (Newton, Mass.) and aqueous tetramethylammonium hydroxide developers as are known in the art.

The areas of the coated substrate that are bared upon development may then be permanently altered, for example selectively plated or etched by known procedures. For instance, the underlying substrate bared of the photoimageable composition upon development can be chemically etched, e.g. in the case of a copper substrate, using an etchant of a cupric chloride solution or ammonium persulfate solution. After such processing, the remaining resist may be removed by standard procedures, for example a N-methyl pyrrolidinone-based stripper solution or a relatively concentrated aqueous alkaline solution, e.g. a 10 weight percent aqueous sodium hydroxide solution, used at elevated temperatures such as 50° C.

The photoimageable compositions of the invention also will be suitably formulated other than as an aqueous emulsion and applied to a substrate by film forming methods other electrodeposition. For example, a photoimageable composition of the invention may be formulated as a liquid coating composition and applied to a substrate by spin coating, roller coating, dip coating and other coating techniques known in the art. Compositions of the invention also may be applied on a substrate as a dry film. It is understood that the term liquid coating composition is used herein in accordance with its meaning as recognized to those skilled in the art and refers to an organic solvent solution that comprises a photoimageable composition of the invention and where said organic solvent solution is essentially free of water.

A liquid coating composition is generally prepared following prior art procedures for the preparation of photoresists and other radiation sensitive compositions. The solids portion of a composition of the invention is formulated by dissolving the solids in a suitable solvent such as, for example, glycol ethers such as ethylene glycol monomethyl ether, ethylene glycol dimethyl ether, methoxy benzene and the like; Cellosolve$^R$ esters such as methyl Cellosolve acetate, ethyl Cellosolve acetate and propylene glycol monomethyl ether acetate; aromatic hydrocarbons such as toluene, xylene and the like; ketones such as acetone, methyl ethyl ketone, cyclopentanone, cyclohexanone; esters such as ethyl acetate, butyl acetate, hexyl acetate, isobutyl isobutyrate and butyrolactone; amides such dimethylacetamide and dimethyl formamide; chlorinated hydrocarbons such as methylene chloride, ethylene dichloride 1,1,1-trichloroethane, chlorobenzene and ortho-dichlorobenzene; nitrobenzene; dimethyl sulfoxide; alcohols such as diacetone alcohol; and mixtures of the foregoing.

The total solids content of the liquid coating compositions typically does not exceed about 60 to 70 percent by weight of the formulation and, preferably, the solids content varies between about 10 and 50 percent by weight of the total composition. When spin coating, the solids content of the coating solution can be adjusted to provide a desired film thickness based upon the specific spinning equipment utilized, the viscosity of the solution, the speed of the spinner and the amount of time allowed for spinning.

After application of the liquid coating composition onto a surface, it is typically subjected to a pre-exposure soft bake, e.g., heated to about 90° C. to remove solvent until preferably the resist coating is tack free. The coating composition is then imaged and processed as generally described above.

A liquid coating composition of the invention may also be used to form a dry film photoresist laminate. A dry film resist laminate is typically produced by coating the liquid coating composition onto a suitable support such as a polyester film and then covering the resist film with a thin polymer film, for example a polyolefin film. The thin film is peeled away prior to use and the solid resist layer is applied to a substrate surface by means of lamination. See, W. DeForest, *Photoresist Materials and Processes*, pp. 163–212 (McGraw Hill 1975), incorporated herein by reference.

The photoimageable compositions of the invention are particularly useful for the manufacture of printed circuit boards and other articles, for example in a print-and-etch process and a print-and-plate process. See, for example, Coombs, *Printed Circuits Handbook*, McGraw Hill, (3rd ed., 1988), incorporated herein by reference, and the above incorporated U.S. Pat. No. 4,592,816.

Photoimageable compositions of the inventions also may be applied over silicon or silicon dioxide wafers for the production of microprocessors and other integrated circuit substrates. Microelectronic substrates composed of other materials also will be suitably coated with the compositions of the invention for example, aluminum-aluminum oxide and silicon nitride wafers.

The following non-limiting examples are illustrative of the invention.

EXAMPLES 1–3—Preparation of Resins Useful in the Compositions of the Invention

Example 1

Preparation Of Polymer Comprising Acid Labile Groups t-Butylacetate-modified poly(4-vinylphenol) was prepared as follows. 20 g of 10% hydrogenated poly(4-vinylphenol) was dissolved in 200 mL of dry dimethylformamide under nitrogen. This 10% hydrogenated poly(vinylphenol) was PHM-C Grade obtained from Maruzen Oil of Tokyo, Japan; the percent hydrogenation refers to the mole percent of nonaromatic cyclic alcohol groups of the resin. To this solution was added 0.80 g of NaH (95%) and the reaction mixture allowed to stir for 30 minutes. 5.4 g of t-butyl chloroacetate was then added dropwise to the solution and the reaction mixture heated at 70° C. for 18 hours. After cooling and filtering the polymer reaction product was isolated by adding the reaction solution to 3 L of water. The precipitate was collected by filtration, re-slurried in water and re-filtered. The thus obtained polymer was then dried at 50° C. under vacuum for 24 hours. The degree of substitution of the hydroxyl groups of the poly(vinylphenol) by t-butyl acetate groups was about 22 percent as indicated by proton and carbon-13 NMR.

Example 2

Preparation of Carrier Resin Containing Both cataphoteric and Anaphoretic Carrier Groups 910 grams of propylene glycol methyl ether solvent was placed in a four-neck round bottom flask fitted with a mechanical stirrer, nitrogen inlet tube, condenser and thermometer. Nitrogen gas was bubbled through the solvent and exhausted through an oil bubbler attached to the condenser to degas the solvent and flush air from the reaction vessel. The nitrogen inlet tube was raised above the level of the solvent and a flow was maintained to keep a positive pressure of nitrogen in the flask throughout the reaction. A thermostatically controlled heating mantle was fitted to the underside of the flask and the solvent was heated to 105° C. A free radical initiator solution was prepared by adding 13 grams of t-butyl peroctoate to 117 grams of propylene glycol methyl ether. A monomer mixture was prepared by combining 100 grams of methacrylic acid, 80 grams of 2-(dimethylamino)ethyl methacrylate, 330 grams of butyl methacrylate, and 490 grams of methyl methacrylate for a total weight of 1000 grams (1060 milliliters). The monomer mixture was pumped into the reaction flask at a rate of 5 ml/min while simultaneously pumping he initiator solution at a rate of 0.5 ml/min. An additional 0.6 grams of t-butyl peroctoate was added to the reaction flask 30 minutes after addition of all the monomer mixture. The polymer solution had a solids content of 50 weight percent.

Example 3

Preparation of Carrier Resin Containing Anaphoretic Carrier Groups

A tetrapolymer was prepared as a solution containing 50 weight percent solids by the procedures of Example 2 above, except (1) the monomer mixture employed consisted of 100 grams methacrylic acid, 87 grams hydroxyethyl methacrylate, 374 grams of butyl acrylate and 439 grams of methyl methacrylate; and (2) ethylene glycol dimethyl ether (diglyme) was used in place of propylene glycol methyl ether.

Example 4

Synthesis of the Acid Generator of dodecyl-3,4,5-tris-(methanesulfonyloxy) benzoate A solution of 20.0 g (59.9 mmol) dodecyl-3,4,5-trihydroxybenzoate in 300 ml pyridine was stirred in a 500 ml 3-necked round bottom flask under $N_2$ purge. The reaction vessel was chilled to about 5° C. by an ice bath. Via an addition funnel, 22.3 g (195 mmol) of methanesulfonyl chloride was added dropwise to the cooled solution. The cooled mixture was then allowed to stir for about 2 hours. The reaction solution was then poured into 300 ml of stirring water to precipitate the title compound. The precipitate was filtered, washed with small portions of water, and slurried for several hours in slightly acidic aqueous solution. The material was then reslurried with pure water, the solid material refiltered, rinsed with water, and then dried in a vacuum oven.

Example 5

Preparation of Electrodepositable Photoimageable Composition

A preferred electrodepositable composition of the invention was prepared consisting of the following components of the indicated amounts:

| Components | Amounts |
|---|---|
| Material containing acid labile groups Polymer prepared in Example 1 above | 2.03 g |
| Carrier resin 50 wt. % solution of resin prepared in Example 3 above | 16.05 g |
| Photoacid generator Dodecyl-3,4,5-tris-(methanesulfonyloxy) benzoate | 0.26 g |
| Coalescing Agent Ethylene glycol-2-ethylhexyl ether | 1.0 g |
| Dye Morton ERO Blue (Morton Thiokol) | 0.05 g |

The electrodepositable formulation was prepared by dissolving the polymer of Example 1, the tetrapolymer of Example 3, and dodecyl-3,4,5-tris(methanesulfonyloxy) benzoate in approximately 2 ml of diglyme. The coalescing agent and dye were then added to the diglyme solution. The thus prepared solution was then admixed with 1 ml ethanolamine to thereby ionize the carboxyl groups of the carrier resin. The composition was then added to 100 ml of deionized water to form a stable emulsion of the photoimageable composition.

Example 6

Electrodeposition and Formation of Relief Images

The emulsified composition prepared in Example 5 above was heated to a temperature of about 35° C. A 1 inch by 3 inch stainless steel plate was immersed in the emulsion and used as the cathode and a precleaned copper clad circuit board base material of the same size was immersed in the emulsion and used as the anode. The anode to cathode spacing was about 2 inches. A direct current voltage of about 75 volts was applied across the electrodes for about 10 seconds to provide a uniform resist film thickness of about 3 microns on the circuit board substrate.

The resist coated circuit board substrate was dried in a convection oven at 90° C. for about 5 minutes and then imaged through a polyester strip phototool using a 5000 W Mimir exposure unit (broad band mercury) at an exposure dose of about 3 $J/cm^2$. The imaged substrate was then post-exposure baked in a convection oven at 95° C. for about 30 minutes. The coating layer was then developed by immersion of the coated substrate in 0.36N aqueous sodium hydroxide solution at 30° C. to yield a good quality positive tone relief image on the substrate.

Example 7

An electrodepositable composition was prepared as described in Example 6 and having the same components and amounts thereof as the composition of Example 5 except the following carrier resin was substituted for the carrier resin of Example 3: a terpolymer formed by free radical polymerization of acrylic acid, L-butylmethacrylate and methylmethacrylate. The acrylic acid content of this terpolymer was 12.2 mole percent, the balance of the polymer being comprised of units of the t-butyl and methyl methacrylates. This composition was electrodeposited, imaged and developed by the procedures of Example 6 to provide a good quality positive tone relief image on the substrate.

The foregoing description of the invention is merely illustrative thereof, and it is understood that variations and modifications can be effected without departing from the scope and spirit of the invention as set forth in the following claims.

What is claimed is:

1. An emulsified photoimageable electrodepositable photoresist composition comprising:
   a phenolic resin containing one or more acid labile groups and being essentially free of any at least partially ionized carrier groups prior to photoactivation of the composition, a carrier resin containing functional groups that are at least partially ionized in an amount sufficient to enable electrodeposition and essentially free of acid labile groups, and a photoacid generator compound.

2. The composition of claim 1 where the acid labile groups are selected from the group consisting of acetate groups and oxycarbonyl groups.

3. The composition of claim 1 where the carrier resin is an acrylate-based resin.

4. The composition of claim 1 where the carrier resin is selected from the group consisting of (1) a carrier resin that contains anaphoretic functional groups and substantially no cataphoretic functional groups; (2) a carrier resin that contains cataphoretic functional groups and substantially no anaphoretic functional groups; and (3) a carrier resin that contains both cataphoretic functional groups and anaphoretic functional groups.

5. The composition of claim 1 where the carrier resin comprises one or more at least partially charged moieties selected from the group consisting of amino, carboxyl, sulfonium, sulfoxonium, and phosphonic.

6. The composition of claim 1 where the photoacid generator is selected from group consisting of sulfonate esters, onium salts and halogenated non-ionic photoacid generators.

7. The composition of claim 1 comprising (1) a phenolic polymer where at least a portion of the hydroxyl groups of the polymer are bonded to acid labile groups, (2) an acrylate-based carrier resin containing a sufficient amount of carrier groups to enable electrodeposition of the photoimageable composition, and (3) a photoacid generator.

8. The composition of claim 7 where the acid labile groups are acetate groups.

9. A process for forming a relief image on a conductive surface, comprising:
(a) electrophoretically applying an emulsified photoimageable photoresist composition on the conductive surface, the composition comprising a phenolic resin containing one or more acid labile groups and being essentially free of any at least partially ionized carrier groups prior to photoactivation of the composition, a carrier resin containing functional groups that are at least partially ioinized in an amount sufficient to enable electrodeposition and essentially free of acid labile groups, and a photoacid generator;
(b) exposing the composition coating layer to activating radiation; and
(c) developing the exposed composition coating layer to provide a relief image.

10. The process of claim 9 where the composition coating layer is developed with an alkaline aqueous solution.

11. The process of claim 9 where areas of the coating layer exposed to activating radiation become more soluble in an aqueous alkaline solution than unexposed areas of the coating layer.

12. The process of claim 9 where the composition layer is thermally treated after exposure and prior to development, and whereby said thermal treatment results in acid-catalyzed cleavage of the acid labile groups in exposed regions of the coating layer.

13. The process of claim 9 where the conductive surface is a copper clad printed circuit board substrate.

14. The process of claim 9 further comprising permanently altering the surface bared of the coating layer upon development.

15. An article of manufacture comprising a substrate, at least a portion of the substrate surface being conductive and coated with a photoimageable composition comprising in electrophoretically applied coating layer, the coating layer comprising a phenolic resin containing one or more acid labile groups and being essentially free of any at least partially ionized carrier groups prior to photoactivation of the composition, a carrier resin containing functional groups that are at least partially ionized in emulsion in an amount sufficient to enable electro-deposition and essentially free of acid labile groups, and a photoacid generator.

16. The article of claim 15 where the substrate is a printed circuit board substrate.

17. The composition of claim 1 where the phenolic resin has acetate or oxycarbonyl acid labile groups and the photoacid generator is selected from the group consisting of sulfonate esters, onium salts and halogenated non-ionic photoacid generators.

18. The process of claim 9 where the carrier resin comprises one-or more at least partially charged moieties selected from the group consisting of amino, carboxyl, sulfonium, sulfoxonium, and phosphonic.

19. The process of claim 9 where the photoacid generator is selected from group consisting of sulfonate esters, onium salts and halogenated non-ionic photoacid generators.

20. The process of claim 9 where the material comprising acid labile groups is a phenolic resin with acetate or oxycarbonyl acid labile groups and the photoacid generator is selected from the group consisting of sulfonate esters, onium salts and halogenated non-ionic photoacid generators.

21. The process of claim 9 where the photoimageable composition is applied anaphoretically on the conductive substrate.

22. The process of claim 9 where the photoimageable composition is applied cataphoretically on the conductive substrate.

* * * * *